United States Patent [19]

De La Moneda

[11] 4,029,522
[45] June 14, 1977

[54] METHOD TO FABRICATE ION-IMPLANTED LAYERS WITH ABRUPT EDGES TO REDUCE THE PARASITIC RESISTANCE OF SCHOTTKY BARRIER FETS AND BIPOLAR TRANSISTORS

[75] Inventor: Francisco H. De La Moneda, Reston, Va.

[73] Assignee: International Business Machines Corporation, Armonk, N.Y.

[22] Filed: June 30, 1976

[21] Appl. No.: 701,375

[52] U.S. Cl. .............................. 148/1.5; 148/187; 148/18 8; 357/91

[51] Int. Cl.$^2$ ..................................... H01L 21/265

[58] Field of Search .................... 148/1.5, 187, 188; 357/22

[56] References Cited

UNITED STATES PATENTS

| | | | |
|---|---|---|---|
| 3,413,531 | 11/1968 | Leith | 148/1.5 X |
| 3,431,150 | 3/1969 | Dolan, Jr. et al. | 148/1.5 |
| 3,852,119 | 12/1974 | Gosney et al. | 148/1.5 |

OTHER PUBLICATIONS

Fairfield et al. "Contact Buried Ion Implanted Layers," IBM Tech. Discl. Bull., vol. 13, No. 5, Oct. 1970, p. 1052.

*Primary Examiner*—L. Dewayne Rutledge
*Assistant Examiner*—J. Davis
*Attorney, Agent, or Firm*—John E. Hoel

[57] ABSTRACT

A method is disclosed to implant layers in semiconductor substrates with asymmetrical edges, that is, one edge slopes towards the surface of the substrate and the other terminates abruptly inside the bulk. The method involves using lift-off techniques to make ion-stopping masks with near-vertical sidewalls which delineate the abrupt edges of the ion-implanted layers. The application of this method to fabricate Schottky barrier FET's and bipolar transistors yields devices with reduced parasitic resistance without adversely impacting other related electrical parameters such as breakdown voltage and capacitance.

23 Claims, 21 Drawing Figures

METHOD TO FABRICATE ION-IMPLANTED LAYERS WITH ABRUPT EDGES TO REDUCE THE PARASITIC RESISTANCE OF SCHOTTKY BARRIER FETS AND BIPOLAR TRANSISTORS

FIELD OF THE INVENTION

The invention disclosed relates to semiconductor fabrication processes and devices and more particularly to an ion-implantation process and the resulting semiconductor product.

BACKGROUND OF THE INVENTION

High performance Schottky barrier FET's and bipolar transistors have active regions in the bulk of a semiconductor body thus avoiding the deleterious effects of surface discontinuities on carrier mobilities. On the other hand, to make possible large scale integration, it is necessary to bring the active bulk regions of the device in contact with the top surface of the structure. In doing this, parasitic resistive and capacitive elements are created which degrade the high performance of the bulk device. Compromises between resistive and capacitive parasitics are difficult to achieve since decreasing or increasing the doping to minimize one of them, respectively, adversely impacts the other. Moreover, doping levels are generally determined by the design of bulk devices.

The performance obtained from conventionally fabricated Schottky barrier FET's is limited by:
1. High source-gate and drain-gate parasitic resistance,
2. High interelectrode capacitance, and
3. Low interelectrode breakdown voltage.

For bipolar transistors the problems include:
1. High extrinsic base resistance,
2. Low base-emitter breakdown voltage,
3. High base-emitter sidewall capacitance and
4. Self-biasing along the emitter width, a deleterious effect known as emitter crowding.

OBJECTS OF THE INVENTION

It is therefore an object of the invention to fabricate high performance semiconductor devices in an improved manner.

It is another object of the invention to build high performance semiconductor devices in the bulk of the semiconductor medium in an improved manner.

It is still a further object of the invention to build a high performance semiconductor device in the bulk of the semiconductor medium with reduced capacitive and resistive parasitic elements.

It is still a further object of the invention to build a high performance Schottky barrier FET device with reduced source-gate region and drain-gate region parasitic resistance.

It is still a further object of the invention to build a high performance Schottky barrier FET device with reduced interelectrode capacitance.

It is still a further object of the invention to build a high performance Schottky barrier FET device with higher interelectrode breakdown voltage.

It is still a further object of the invention to build a high performance bipolar transistor device with a reduced extrinsic base resistance.

It is still a further object of the invention to build a high performance bipolar device with reduced emitter crowding effect.

SUMMARY OF THE INVENTION

These and other objects, features and advantages are accomplished by the process and device invention disclosed herein.

The inventive process forms asymmetrical, buried, high conductance layers in the semiconductor bulk. It comprises steps including forming a first oxide layer on the surface of the semiconductor substrate, having an opening with tapered sidewalls and the portion of the substrate surface exposed through the opening covered by one or more dielectric layers whose total thickness is less than that of the first layer. Then depositing a layer of a lift-off resist and exposing the resist so as to delineate a first region with one edge inside the opening in the first layer and the opposite edge overlapping one of the tapered sidewalls. Then removing the resist from the first region and depositing a layer of ion-beam stopping material. Next, the remaining portion of the resist layer is removed which simultaneously lifts off the ion-stopping layer above it. The remaining ion-stopping layer constitutes a mask with near-vertical sidewalls. A blanket implant follows which penetrates the unmasked portion of the first layer's opening. There results a high conductance layer formed in the bulk of the substrate having a first end substantially following the contour of one of the tapered sidewalls of the first layer so as to contact the surface of the substrate and a second end abruptly terminating within the bulk of the substrate and aligned with respect to the edge of the ion-stopping mask.

The method permits the fabrication of asymmetrical buried layers with abrupt edges. The lift-off technique is used to fabricate a mask with near-vertical sidewalls which delineate the abrupt edges of the buried layers. The introduction of this method into fabrication processes for Schottky barrier FET's and bipolar transistor yields devices with improved electrical characteristics. For the Schottky barrier FET, the improvements include a reduced source-gate region and drain-gate region parasitic resistance, a reduced interelectrode capacitance, a larger interelectrode breakdown voltage, and a gate self-aligned with respect to the buried layers. For bipolar transistors, the improvements include a reduced extrinsic base resistance without lowering the base-emitter breakdown voltage or increasing the base-emitter sidewall capacitance, a channel stopper in the base region, and a reduction of the emitter crowding effect.

DESCRIPTION OF THE FIGURES

These and other objects, features and advantages of the invention can be more fully appreciated with reference to the accompanying drawings.

DISCUSSION OF THE PREFERRED EMBODIMENT

Figure 2A:
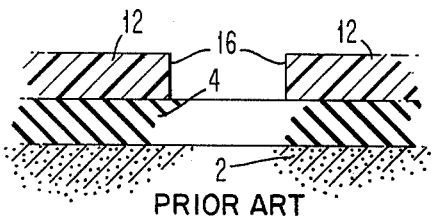
FIG. 2a shows a prior art polymethyl methacrylate (PMM) resist with vertical sidewalls.
Figure 2B:
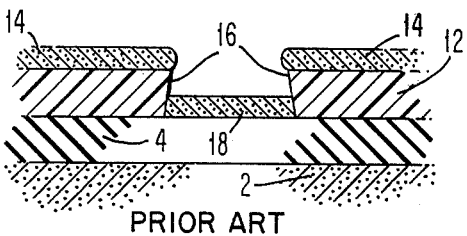
FIG. 2b shows a prior art PMM resist lift-off technique.

The prior art includes lift-off techniques for forming photolithographic masks such as that disclosed by M. Hatzakis, "Electron Resist for Microcircuit and Mask Production", *J. Electrochem. Soc.*, Vol. 116, No. 7, July 1969, pp. 1033–1037. FIGS. 2a and 2b herein reproduce FIGS. 5a and 7 of the Hatzakis paper, showing how a semiconductor material 18 can be deposited through a window in a layer of lift-off resist 12 composed of polymethyl methacrylate (PMM). The PMM is a positive acting electron-sensitive resist which forms nearly vertical sidewalls 16. After depositing the conductor or insulator layer 14 and 18, the lift-off layer 12 is dissolved away allowing layer 14 to be lifted off, leaving the layer 18 in place.

Prior art lift-off resists have not been employed in ion-implantation processes. If the lift-off resist layer 12 of FIG. 2b were, itself, used as an ion-implantation mask, buried conductive regions would be formed with all edges abruptly terminated within the bulk of the semiconductor substrate where electrical contact cannot be made to the surface. Furthermore, the buried region is not ameanable to self-alignment with other device structures due to the low melting and decomposition temperatures of the lift-off resist.

Figure 5:
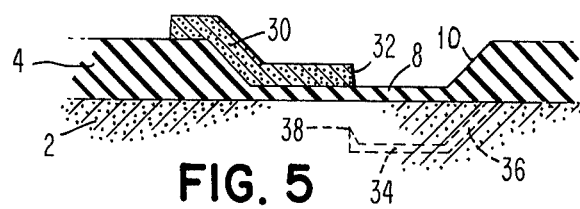
FIG. 5 shows an ion-implanted, asymmetric buried layer.
Figure 3:
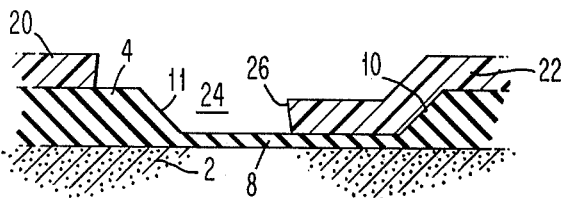
FIG. 3 shows the formation of a window 24 in a lift-off resist 22 with a vertical sidewall 26.
Figure 4:
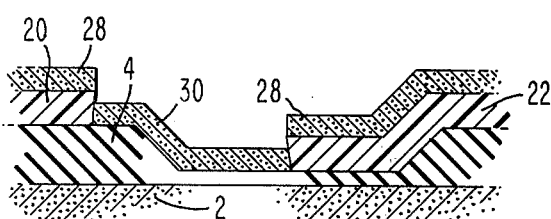
FIG. 4 shows layers of lift-off resist 22 and of ion-stopping material 30 suitable for the lift-off technique.

One aspect of the invention disclosed herein is to employ a precise ion-implantation stopping mask formed by a lift-off technique, to delineate buried conductive regions which are abruptly terminated on one end and gradually slope toward the surface on the other end. Another aspect of the invention is to employ this ion-implantation stopping mask to also delineate additional structures in the device being fabricated, which will be self-aligned with the abruptly terminated ends of the buried conductive regions. This is accomplished as is shown in FIGS. 3, 4 and 5 wherein the lift-off resist layer 22 has at least one of its vertical sidewalls 26 located over an opening 24 in an underlying layer 4. The layer 4 has a tapered sidewall 10 covered by the lift-off resist layer 22. A layer of ion-implantation stopping material 28 and 30 is deposited over all surfaces and the lift-off resist layer 22 is then dissolved. This permits the lifting off of the layer 28 leaving the sidewall ion-stopping layer 30 and the uncovered sidewall 10 of layer 4. A blanket ion-implantation will then result in the formation of a buried conductive region 34 having an abruptly terminated end 38 aligned with sidewall 32 and an opposite end 36 beneath sidewall 10, sloping toward the surface of substrate 2. Furthermore, the ion-stopping layer 30, which may be refractory material such as $SiO_2$, can itself serve as the mask for a subsequently formed self-aligned device structure such as the gate region in an FET device or an emitter contact in a bipolar transistor device.

In this disclosure a fabrication method is described to reduce parasitic resistance by means of high conductance buried layers. This layer or layers are implanted without altering the doping levels of the active regions of the device. Thus, parasitic resistances can be minimized independently of the rest of the structure. The method is quite general and its application to Schottky barrier FETs and bipolar transistors is illustrated. The essential steps of the fabrication sequence are given first. Specific applications follow.

Fabrication of Asymmetrical, High-Conductance Buried layers

STEP 1A

Figure 1:
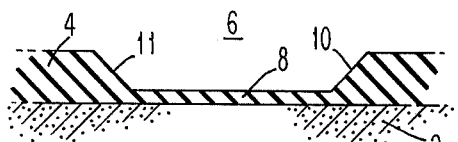
FIG. 1 illustrates a cross-sectional view of the semiconductor structure after the window 6 is delineated in the oxide layer 4.

Start with an n-type semiconductor substrate 2 of FIG. 1. Grow a 6000Å thick $SiO_2$ layer 4. Deposit phospho-silicate glass (PSG) if the taper of subsequently etched oxide windows is to be less than 45°.

STEP 2A

Using mask No. 1, define and etch window 6 underneath which the desired layer is to be buried as shown in FIG. 1. Regrow $SiO_2$ layer 8 to a thickness of 1000Å so that the magnitude of the difference in thickness between layers 4 and 8 is approximately equal to the depth of the buried layer.

FIGS. 2a and 2b illustrate prior art Hatzakis technique for the fabrication of a device structure 18 by means of a lift-off technique. This prior art technique is modified in the subject invention to produce an ion-implantation stopping mask. As described by Hatzakis, a device structure is deposited after exposing and developing windows in the lift-off resist 12. If the deposited layer 14 is thinner than the resist 12, it will not completely fill up the opening so that a gap will exist between the material 18 covering the bottom of the window and the top of the resist 12. A solvent agent can then reach the resist 12 through the gap and dissolve the unexposed resist 12, thereby lifting off the layer 14 lying on top. The deposited layer 18 will be left where the window was with near-vertical sidewalls.

According to the article by M. Hatzakis, the slant of this layer 18 is between 2° to 5° for a resist 12 thickness of 5000A. The important considerations for this lift-off technique are thickness of the resist layer 12 and substrate temperature during deposition of material 18. The thinner the resist 12, the closer to vertical the sidewalls 16 are.

The following steps in the subject invention include the above lift-off technique employing PMM, to produce implanted layers with asymmetrical shapes. It should be noted that other lift-off techniques can be used so long as they delineate a precise edge to the ion-stopping mask.

STEP 3A

Cover substrate 2 of FIG. 1 with PPM resist 20 and 22 as shown in FIG. 3. Use a programmed electron beam to expose that section 24 overlapping the oxide taper 11 where a vertical mask edge 26 is needed. Develop resist to remove exposed regions. For 5000A thick resist 20, the slope of the sidewalls 26 is 2°–5°. The thinner the resist 20, the closer the sidewall 26 to vertical.

STEP 4A

Deposit material layers 28 and 30 shown in FIG. 4, thinner than the resist 20 of step 3A. $Si_3N_4$ is a good material choice since it has a density 1.6 times larger than that of $SiO_2$. Consequently, 4200A of $Si_3N_4$ are equivalent to 7000A of $SiO_2$, and the 5000A of resist 20 used in step 3A are sufficient. The substrate temperature should not exceed 100° C during deposition. The deposition of $Si_3N_4$ layers at low temperature is reported by R. Gereth and W. Scherber in "Properties of Ammonia-Free-Nitrogen-$Si_3N_4$ Films Produced at Low Temperatures", *J. Electrochem. Soc.*, Vol. 119, No. 9, September 1972, pp. 1248–1254.

STEP 5A

Lift-off PMM resist layers 20 and 22. The edge 32 of the remaining $Si_3N_4$ layer 30 in FIG. 5 should be near-vertical. After the wafer is irradiated by a blanket phosphorous implant of $1\times10^{14}$ ion/$cm^2$ at 450 Kev, the resulting buried layer 34 should be at a depth of 5000A with one edge 36 sloping toward the surface and the other 38 terminating abruptly underneath edge 32 of the $Si_3N_4$ mask 30. The implanted impurities are activated with a low temperature anneal which will not appreciably diffuse them.

The fabrication processes for improved Schottky barrier FET and bipolar transistor incorporating these buried layers are described next.

Schottky Barrier FET with Low Source-Gate Region and Drain-Gate Region Resistance In Drangeid, et al., "Method for Making a Schottky-Barrier Field Effect Transistor," U.S. No. 3,804,681 Apr. 16, 1974, assigned to IBM, several approaches are described to fabricate Schottky barrier FETs with low resistance zones between source and gate region to improve device transconductance and between gate region and drain to improve power dissipation and R-C time constant. These zones 40 lie in one plane at either the interface between substrate 42 and conducting layer 44 as shown in FIG. 6a, or at the top of the conducting layer 44 as in FIG. 6b.

Figure 6A:
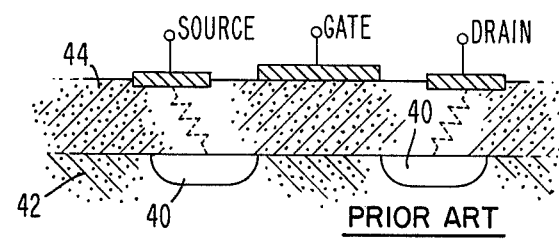
FIG. 6a shows a prior art Schottky barrier FET with a low resistance zone embedded in the substrate and parasitic resistance between said substrate and source/-drain contacts.
Figure 6B:
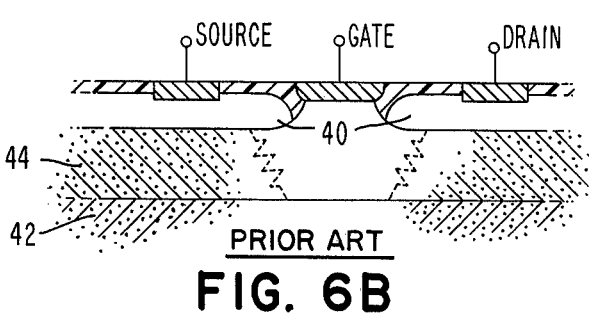
FIG. 6b shows a prior art Schottky barrier FET with low resistance zones on top of the conductive layer.
Figure 7:
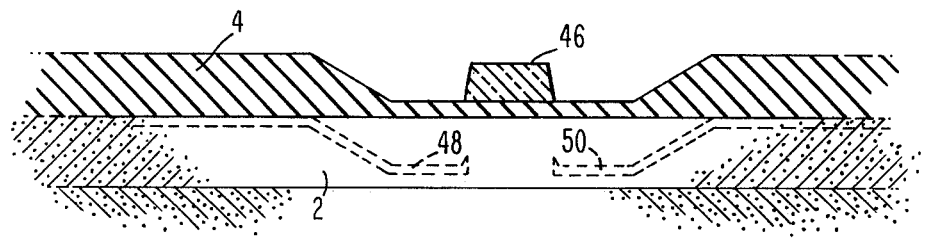
FIG. 7 shows a cross-section of a Schottky barrier FET after implantation of buried layers.

Since in both instances of FIGS. 6a and 6b, the low resistance zone 40 is one dimensional, there is always some remaining parasitic resistance. Using the disclosed inventive technique, these remaining resistances are eliminated since the implanted buried layers slope towards the surface. A description of the fabrication steps follow:

The previously given steps 1A through 5A are carried out for a symmetrical structure appropriate for Schottky barrier FET's. At step 5A, the corresponding cross-section is shown in FIG. 7.

Figure 8:
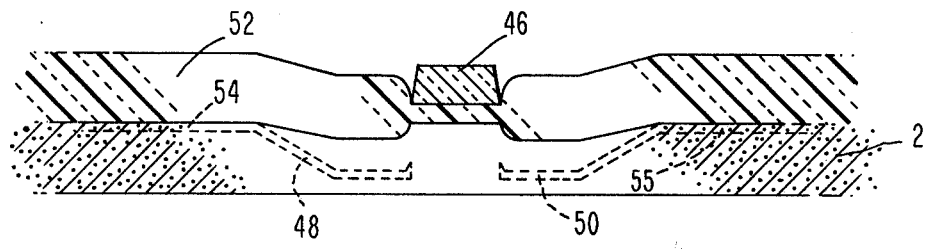
FIG. 8 shows the structure of FIG. 7 after growth of recessed oxide.

The $Si_3N_4$ layer 46 is next utilized for a localized oxidation of the thin oxide region surrounding 46. This must be done while assuring that the implanted layers 48 and 50 diffuse as little as possible. To this end, the oxidation should be done in steam. A cycle of 1.5 hr at 900° C yields 5500A of oxide and spreads the implant about 2000A. Another alternative is to carry out the oxidation at high pressure in order to bring down the temperature to within 700° C. The cross-sectional view of the structure with recessed oxide 52 is shown in FIG. 8. Because of the recessed oxide 52 partially fills the interelectrode space, the corresponding capacitance is reduced and the interelectrode breakdown voltage is larger than in conventionally made devices with the same geometrical dimensions. Since phosphorous piles up during the oxide growth, its concentration near the surface 54, 55 remains high. The significance of this will be discussed in connection with the fabrication of the source and drain ohmic contacts.

STEP 6B

Figure 9:
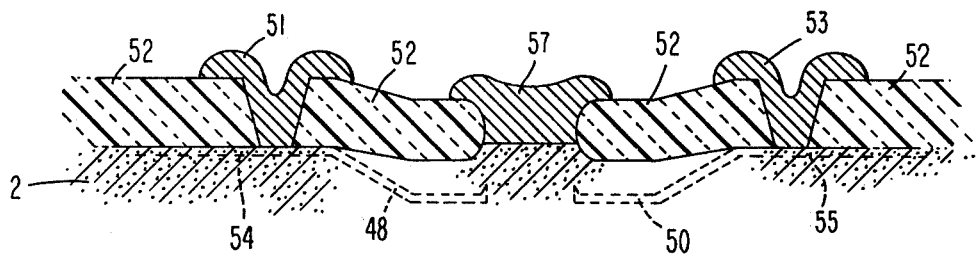
FIG. 9 shows a cross-section of the finished Schottky barrier FET with asymmetrical buried layers.

Use mask No. 3 to open windows for source and drain contacts 51 and 53 of FIG. 9. The gate window does not need mask definition since it is opened by dip etching into warm phosphoric acid which selectively etches $Si_3N_4$ layer 46, thus making possible self-alignment of the gate electrode 57 with respect to the abrupt edge of the buried layers. The remaining $SiO_2$ covering the gate is removed with a dip etch in HF. Mask 4 is used to define the pattern for the metallurgy after its deposition. Notice the due to the high impurity concentration of the layers 54 and 55 at the surface, source and drain ohmic contacts 51 and 53 are automatically established. The finished structure is shown in FIG. 9.

Bipolar Transistor With Reduced Extrinsic Base Resistance

Asymmetrical buried layers are next used to lower the extrinsic base resistance of bipolar transistors. This s the resistance between the outer edges of the active base region and the base ohmic contacts. The process is as follows.

STEP 1C

Figure 10:
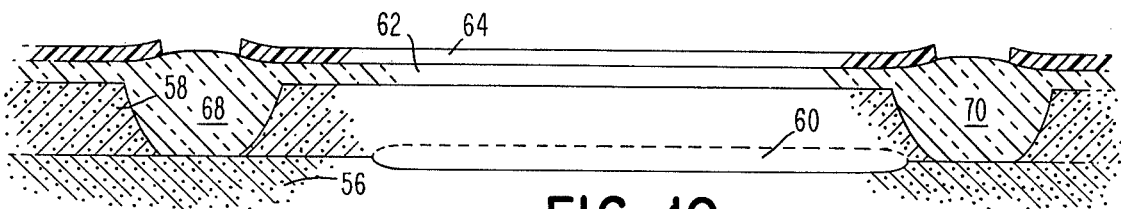
FIG. 10 illustrates the formation of oxide isolation regions surrounding the pocket where a bipolar transistor will be fabricated.

Use mask No. 1 in FIG. 10 to deposit an nepi layer 58 after diffusing an N+ as buried layer 60, into the initial p-type substrate 56, through the opening made with mask No. 1.

STEP 2C.

After etching an oxide layer used as a diffusion mask during step 1C, grow $SiO_2$ layer 62 on the epi layer 58. This oxide will be protecting the final structure and hence its thickness is determined from considerations related to oxide breakdown voltage and inversion of the p-type base region. The latter problem is eliminated by the buried layer implanted at step 12C which, among other things, acts as an inversion channel stopper. Thus, a 1000A thick layer is sufficient. Next, deposit a 500A thick layer 64 of $Si_3N_4$, which is used for a localized oxidation in step 3C and as an etch mask in step 13C. The thickness of the $Si_3N_4$ layer 64 is chosen so that the polysilicon layer evaporated during step 10C does not have to be excessively thick.

STEP 3C USING MASK No. 2

Use mask No. 2 to open windows for oxide isolation regions 68 and 70, as shown in FIG. 10. Etch $SiO_2$ layer 62, using the $Si_3N_4$ layer 64 as an etch mask. Etch a moat into the n- epi layer defined by these windows. Grow thermal oxide 68 and 70 inside these moats until the oxide isolation is coplanar with the rest of the structure. Steps 1C through 3C are typical of the localized oxidation technique. Since the $Si_3N_4$ layer 64 is a good mask against gallium, a channel stopper underneath the oxide isolation is commonly introduced by means of a blanket gallium diffusion.

STEP 4C

Figure 11:
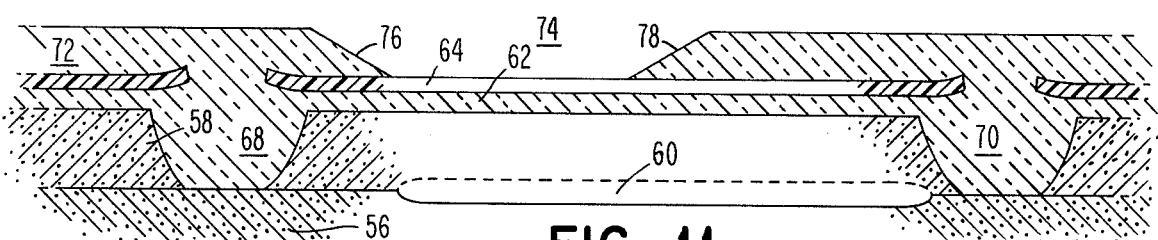
FIG. 11 shows tapered oxide sidewalls forming the base window for the structure of FIG. 10.

In FIG. 11 deposit a layer 72, composed of $SiO_2$ and PSG. The total thickness of this layer 72 should be able to block the implant of step 12C. For the transistor under consideration, 8000A is sufficient.

STEP 5C USING MASK No. 3

Use mask No. 3 to open window 74 for the base dopant deposition. The tapers 76 and 78 of this window are determined by the PSG content of the layer 72 deposited at step 4C, as shown in FIG. 11.

STEP 6C

Figure 12:
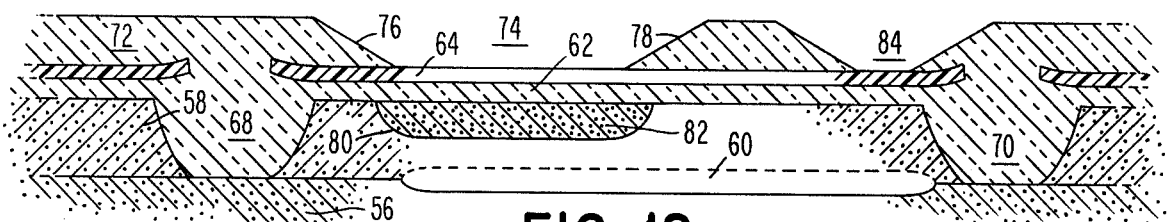
FIG. 12 shows the structure of FIG. 11 after implantation of the base region and opening of the window for the collector contact.

Blanket implant a boron dosage of $1.6 \times 10^{12}/cm^2$ at 280 Kev through these $SiO_2$—$Si_3N_4$ layers 62 and 64. Drive-in boron to form base region 82 with its junction 80 at a depth of 6000A, as illustrated in FIG. 12. This junction will be driven deeper during step 11C.

STEP 7C USING MASK No. 4

Use this mask to open window 84 for the collector contact, as shown in FIG. 12, which will be doped during the emitter deposition.

STEP 8C.

Figure 13:
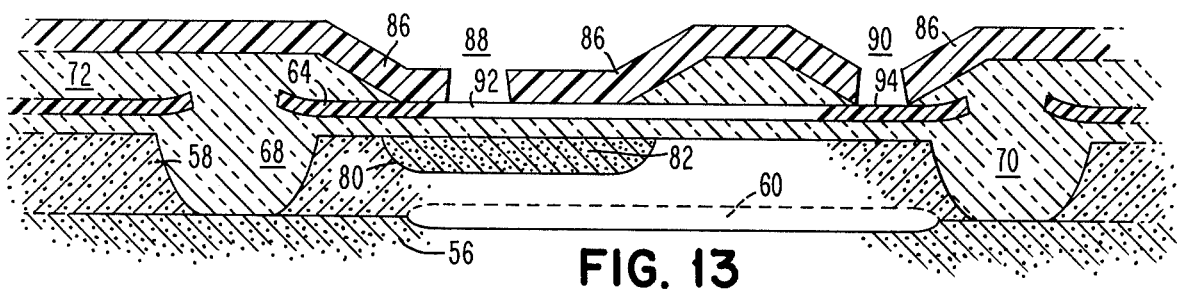
FIG. 13 shows the structure of FIG. 12 after exposing and developing lift-off resist to make windows with near-vertical sidewalls.

Cover wafer with a 700A thick layer of positive acting, electron sensitive PPM resist 86 as shown in FIG. 13. Use an electron beam to define the emitter and collector contact windows 88 and 90, respectively. Develop and bake resist.

STEP 9C

Plasma etch nitride layers 92 and 94, by reactive plasma etching techniques. Blanket implant As dose of $8 \times 10^{15}/cm^2$ at 300 Kev to form emitter region and collector contact 96 and 98, respectively. For both operations, the PMM resist 86 acts as a mask. The base region directly underneath the emitter 96 is the active base region 85.

STEP 10C

Figure 14:
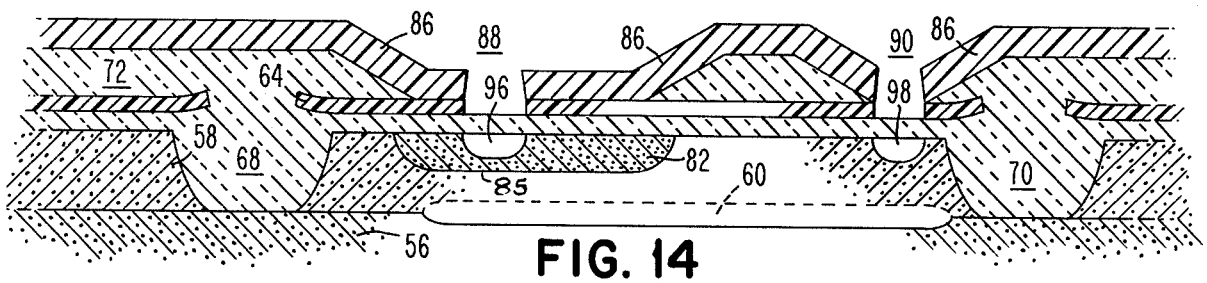
FIG. 14 shows the structure of FIG. 13 with windows etched out of the $Si_3N_4$ layer through which the emitter and collector contact are implanted.
Figure 15:
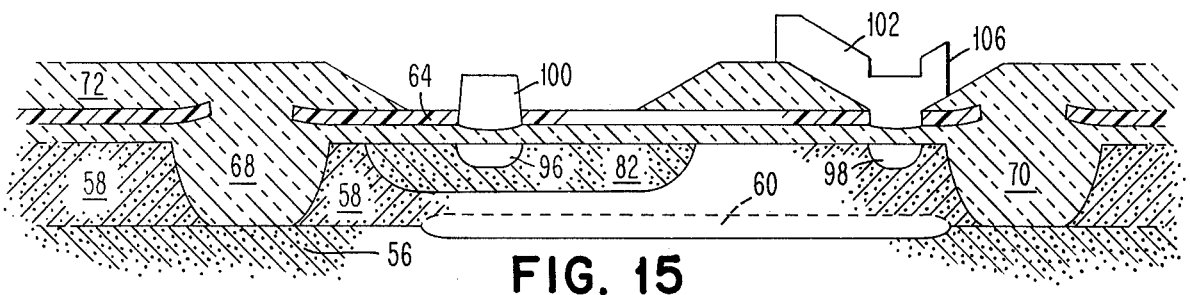
FIG. 15 shows the structure of FIG. 14 with a polysilicon mask in place over the emitter and collector contact.

Evaporate a polysilicon layer over the structure of FIG. 14 keeping the substrate temperature below 100° C. After lifting off the PPM, polysilicon layers 100 and 102 of FIG. 15 are left covering the emitter 96 and collector contact 98. The polysilicon layer 100 masks the subsequent implant of the buried asymmetrical layer from compensating the emitter doping 96 and hence it should be as thick as the layers 64 and 72 combined plus a correction factor of six-tenths of the thickness of the $Si_3N_4$ layer 64 since the density of $Si_3N_4$ is 1.6 times larger than that of silicon. For the transistor design under consideration, 6000A of polysilicon is sufficient since the $SiO_2$ growth of step 11C will thicken this mask to 8800A.

STEP 11C

Figure 16:
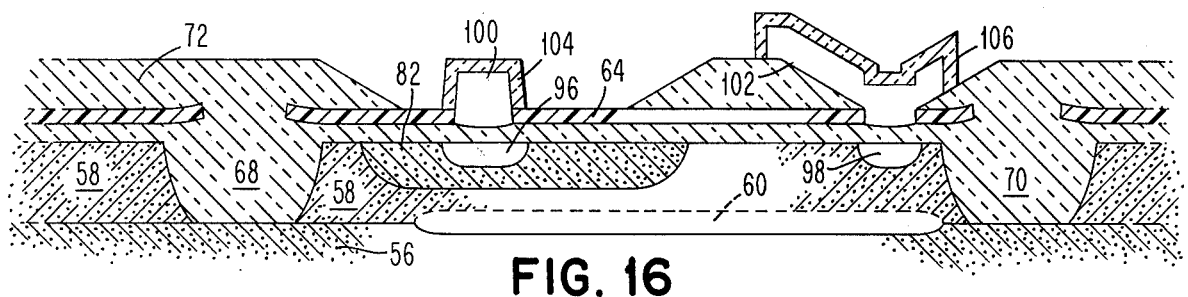
FIG. 16 shows the structure of FIG. 15 with the polysilicon layer enlarged after its oxidation.

Although the lateral spread of the implanted emitter 96 is in the neighborhood of 1000A, there will be some overlap between the emitter 96 and the buried layer implant of step 12C, unless the polysilicon layer 100 masking the emitter 96 is enlarged. To accomplish this, a thermal cycle is used to grow a $SiO_2$ layer 104 on the sidewalls of the polysilicon layer 100 masking the emitter 96 as shown in FIG. 16. This growth should be of the order of 2800A. It may reduce the sharpness of the edges of the initial polysilicon 100, however, with the enlarged mask over the emitter 96, the need for steep mask edges to produce a buried layer with an abrupt edge is less important. This thermal cycle will also drive-in the emitter 96 and anneal its ion-implanted damage.

STEP 12C

Figure 17:
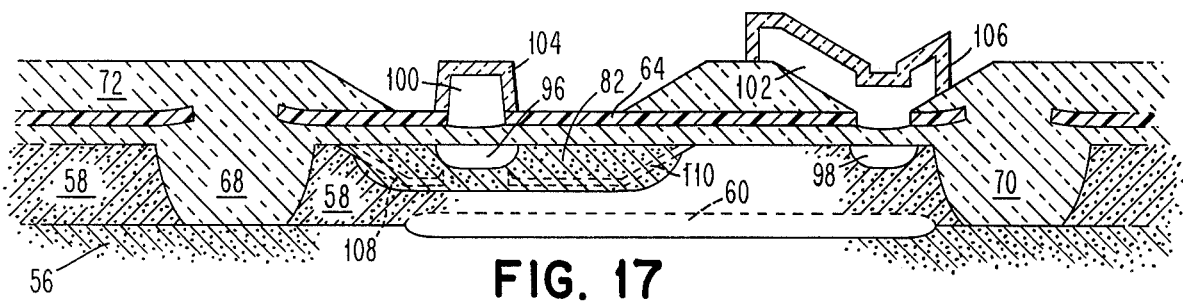
FIG. 17 shows the structure of FIG. 16 after implantation of asymmetric buried layers in the base region.

Blanket implant a boron dosage of $5 \times 10^{13}/cm^2$ at 320 Kev to a depth of 6000A to get asymmetrical buried layers 108 and 110, which intercept the base 82 surface as shown in FIG. 17. Anneal the damage due to ion implantation with a 20 minute 900° C heat cycle.

STEP 13C

Figure 18:
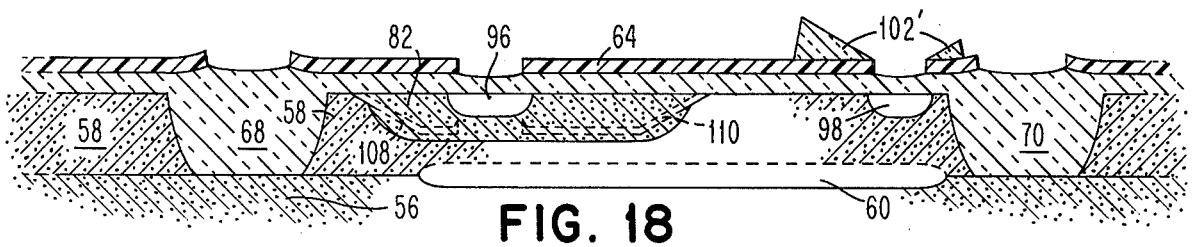
FIG. 18 shows the structure of FIG. 17 where the polysilicon and silicon dioxide masks have been etched away.

Dip etch in HF to remove $SiO_2$ layers 72, 104 and 106. The tapered portion of the layer 72 around the collector contact is not completely removed since it is masked by the polysilicon layer 102. Thus, after dipping in a solution of hydrofluoric and nitric acids to etch layers 100 and 102, a $SiO_2$ mound 102' is left over as shown in FIG. 18.

STEP 14C USING MASKS No. 5, 6 and 7

Figure 19:
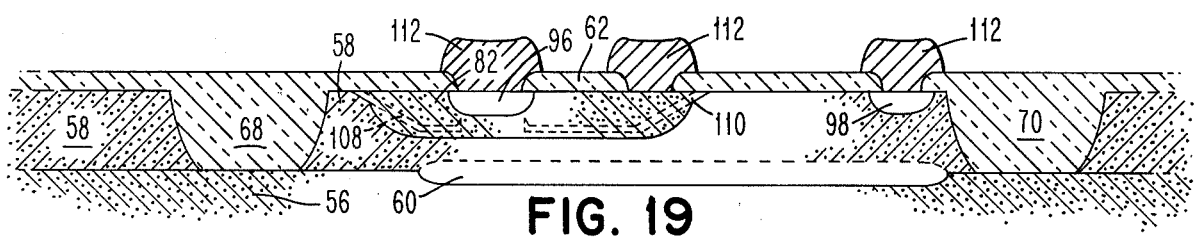
FIG. 19 shows the completed bipolar transistor device with the buried asymmetric layers in the base region which reduce the extrinsic base resistance.

Use mask No. 5 to open contact holes to the emitter 96 and collector 98 as shown in FIG. 19. Mound 102' will also be removed during this etching operation by making the size of the collector contact sufficiently large. Alignment of mask No. 5 to emitter 96 is not critical since the window etched in the $Si_3N_4$ layer 64 at step 9C confines the etching of the contact hole to be within the emitter region. The $Si_3N_4$ layer 64 is next removed by dip etching in warm phosphoric acid. Mask No. 6 is then used to open the contact hole for the base region 82. After deposition of desired metallurgy, mask No. 7 is used to define metallization pattern 112, a cross-sectional view of the finished structure is shown in FIG. 19.

Bipolar transistors fabricated using the proposed method have the following high performance features:

1. The extrinsic base resistance is dominated by the highly doped layers 108 and 110 and therefore is low. This has been achieved without lowering the emitter-base breakdown voltage and capacitance as it would be in the case if the extrinsic base region had been uniformly doped to the same level of the layers 108 and 110.

2. The intersection of the highly doped buried layers 108 and 110 with the surface acts as a channel stopper to prevent surface leakage between collector 98 and emitter 96.

3. In step 11C, $SiO_2$ layer 104 was grown to insure that the subsequent implant of step 12C did not compensate the doping of the emitter 96 or the active base region 85. However, a beneficial effect can be derived from increasing the doping of the active base region 85 at its edges by the lateral spread of the implanted buried layers 108 and 110. The corresponding reduction of the sheet resistance of the active base around its periphery will counteract the nonuniform voltage distribution that arises along the base 85 at high current densities; the so-called emitter crowding effect. The lateral base current flow reduces the emitter-base forward bias from its maximum at the outer edges. The voltage gradient is greatest at the edges where the base current is at its maximum. Therefore, by reducing the sheet resistance near the edges, the voltage gradient is also reduced since the base current drive is externally fixed. A reduction of emitter crowding increases the current at which beta starts to fall off.

In summary, a method to fabricate asymmetrical buried layers with abrupt edges has been described. A lift-off technique is used to fabricate a mask with near-vertical edges which delineates the abrupt edges of the buried layers. The introduction of this method into fabrication processes for Schottky barrier FETs and bipolar transistors yield buried layers whose abrupt edges are self-aligned with respect to the active regions of the device. Several electrical characteristics are improved by using these layers. For the Schottky barrier FET, the improvements are:

1. Reduced source-gate region and drain-gate region parasitic resistance,
2. Reduced interelectrode capacitance, and
3. Larger interelectrode breakdown voltage.

For the bipolar transistor, the improvments are:

1. Reduced extrinsic base resistance without lowering the base-emitter breakdown voltage or increasing the emitter-base sidewall capacitance,
2. Channel stopper in the base region, and
3. Reduction of emitter crowding effect.

Since the improved characteristics are associated with high performance devices, the need for an electron exposure system fits naturally into the fabrication process.

While the invention has been particularly shown and described with reference to the preferred embodiments thereof, it will be understood by those skilled in the art that the foregoing and other changes in form and details can be made therein without departing from the spirit and scope of the invention.

I claim:

1. A method for forming an asymmetrical buried, conductive layer in a semiconductor, comprising the steps of:
   forming a first layer on the surface of a semiconductor substrate, having an opening with a tapered sidewall;
   forming a layer of lift-off resist over said first layer overlapping said tapered sidewall, with a substantially vertical edge inside said opening in said first layer, leaving a portion of said opening in said first layer uncovered;
   forming an ion-stopping layer over said lift-off resist layer and over said portion of said opening in said first layer, with a substantially vertical edge juxtaposed with and formed by said vertical edge of said lift-off resist layer;
   lifting off said ion-stopping layer over said lift-off resist layer, uncovering said tapered sidewall, leaving a residual portion of said ion-stopping layer over said portion of said opening in said first layer;
   ion-implanting a semiconductor dopant material into said semiconductor substrate outside of the region covered by said ion-stopping layer;
   whereby a conductive layer is formed in the bulk of the substrate having a first end substantially following the contour of said tapered sidewall and a second end abruptly terminating within the bulk of said substrate.

2. The method of claim 1, wherein said semiconductor substrate has a background dopant of a first conductivity type.

3. The method of claim 2, wherein said ion-implanted dopant is of said first conductivity type;
   whereby a high conductance buried layer is formed.

4. The method of claim 2, wherein said ion-implanted dopant is of a second conductivity type opposite said first conductivity type;
   whereby a buried p-n junction region is formed.

5. The method of claim 1, wherein said lift-off resist is polymethyl methacrylate which is exposed by an electron beam to delineate said substantially vertical edge therein.

6. The method of claim 5, wherein said ion-stopping layer is composed of materials selected from the group consisting of silicon nitride, silicon dioxide and polycrystalline silicon.

7. In a method for making a field effect transistor in a semiconductor substrate of a first conductivity type, comprising the steps of:
   forming a first layer on the surface of a semiconductor substrate, having an opening with two tapered sidewalls on opposite sides thereof;
   forming a layer of lift-off resist over said first layer overlapping both said tapered sidewalls, having an opening with two substantially vertical sidewalls on opposite sides thereof, each proximate to a corresponding one of said tapered sidewalls;
   forming an ion-stopping layer over said lift-off resist layer with a portion within said opening in said lift-off layer, with substantially vertical edges juxtaposed with and formed by said vertical edge of said lift-off layer;
   lifting off a portion of said ion-stopping layer over said lift-off layer exposing both of said tapered sidewalls, leaving a residual portion of said ion-stopping layer formed within said opening in said lift-off layer;
   ion-implanting a semiconductor material of said first conductivity type into said substrate outside the region covered by said residual ion-stopping layer;
   whereby conductive layers connecting the gate region to the source and drain are formed, each having an abrupt, buried end aligned with respect to said vertical sidewalls of said residual ion-stopping layer and a second end which gradually slopes upward toward the surface of said substrate beneath said tapered sidewalls.

8. The method of claim 7, wherein said lift-off resist is polymethyl methacrylate which is exposed by an electron beam to delineate said substantially vertical edge therein.

9. The method of claim 8, wherein said ion-stopping layer is composed of materials selected from the group consisting of silicon nitride, silicon dioxide and polycrystalline silicon.

10. The method of claim 7, which further comprises the steps of:
removing said residual ion-stopping layer to uncover a gate region on the surface of said semiconductor substrate;
forming a Schottky barrier contact in said gate region;
whereby a Schottky barrier field effect transistor device is formed.

11. The method of claim 10, wherein said lift-off resist is polymethyl methacrylate which is exposed by an electron beam to delineate said substantially vertical edge therein.

12. The method of claim 11, wherein said ion-stopping layer is composed of materials selected from the group consisting of silicon nitride, silicon dioxide and polycrystalline silicon.

13. In a method for making a bipolar transistor in a semiconductor substrate of a first conductivity type, comprising the steps of:
forming a first layer on the surface of a semiconductor substrate, having an opening with two tapered sidewalls on opposite sides thereof;
forming a base region of a second conductivity type in said substrate, beneath said opening in said first layer;
forming a layer of lift-off resist over said first layer overlapping both said tapered sidewalls, having an opening with two substantially vertical sidewalls on opposite sides thereof, over said base region;
forming an emitter region of said first conductivity type in said base region beneath said opening in said lift-off layer;
forming an ion-stopping layer over said lift-off resist layer with a portion within said opening in said lift-off layer, with substantially vertical edges juxtaposed with and formed by said vertical edges of said lift-off layer;
lifting off a portion of said ion-stopping layer over said lift-off layer uncovering both of said tapered sidewalls, leaving the residual portion of said ion-stopping layer formed within said opening in said lift-off layer;
ion-implanting a semiconductor material of said second conductivity type opposite to said first conductivity type, into said base region outside the region covered by said residual ion-stopping layer;
whereby the extrinsic base resistance of the bipolar transistor is reduced by the formation of semiconductor structures, each having an abrupt, buried end aligned with said vertical sidewalls of said residual ion-stopping layer and a second end which gradually slopes upward toward the surface of said base region beneath said tapered sidewalls.

14. The method of claim 13, wherein said lift-off resist is polymethyl methacrylate which is exposed by an electron beam to delineate said substantially vertical edge therein.

15. The method of claim 14, wherein said ion-stopping layer is composed of materials selected from the group consisting of silicon nitride, silicon dioxide, silicon monoxide and polycrystalline silicon.

16. The method of claim 13, which further comprises:
said ion-stopping layer being composed of polycrystalline silicon;
after said step of lifting-off a portion of said ion-stopping layer, the step of growing an oxide layer over the exposed surfaces of said residual portion of said ion-stopping layer;
whereby said ion-implantation step will not compensate the conductivity type for said emitter region.

17. In a method for making a bipolar transistor in a semiconductor substrate having a base region of a first conductivity type, comprising the steps of:
forming a first layer on the surface of a semiconductor substrate, having an opening over said base region with two tapered sidewalls on opposite sides thereof;
forming a layer of lift-off resist over said first layer overlapping both said tapered sidewalls, having an opening with two substantially vertical sidewalls on opposite sides thereof, over said base region;
forming an ion-stopping layer over said lift-off layer with a portion within said opening in said lift-off layer, with substantially vertical edges juxtaposed with and formed by said vertical edges of said lift-off layer;
lifting off a portion of said ion-stopping layer over said lift-off layer uncovering both of said tapered sidewalls, leaving a residual portion of said ion-stopping layer formed within said opening in said lift-off layer;
ion implanting a semiconductor material of said first conductivity type into said base region outside the region covered by said residual ion-stopping layer;
whereby the extrinsic base resistance of the bipolar transistor is reduced by the formation of semiconductor structures, each having an abrupt, buried end aligned with respect to said vertical sidewalls of said residual ion-stopping layer and a second end which gradually slopes upward toward the surface of said base region beneath said tapered sidewalls.

18. The method of claim 17, wherein said lift-off resist is polymethy methacrylate which is exposed by an electron beam to delineate said substantially vertical edges therein.

19. The method of claim 18, wherein said ion-stopping layer is composed of materials selected from the group consisting of silicon nitride, silicon dioxide, silicon monoxide, aluminum oxide and polycrystalline silicon.

20. The method of claim 17, which further comprises:
after said step of forming a layer of lift-off resist, the step of forming an emitter region of a second conductivity type in said base region beneath said opening in said lift-off layer.

21. The method of claim 10, which further comprises:
said ion-stopping layer being composed of polycrystalline silicon;
after said step of lifting off a portion of said ion-stopping layer, the step of growing an oxide layer over the exposed surfaces of said residual portion of said ion-stopping layer;
whereby said ion implantation step will not compensate the conductivity type for said emitter region.

22. In a process for making a semiconductor device, a method for making an ion implantation mask, comprising the steps of:
forming a layer of lift-off resist over a semiconductor substrate, having an opening with two substantially vertical sidewalls on opposite sides thereof;

forming a polycrystalline silicon, ion-stopping layer over said lift-off resist layer with a portion within said opening in said lift-off layer, with substantially vertical edges juxtaposed with and formed by said vertical edges of said lift-off layer;

lifting off a portion of said ion-stopping layer over said substrate, leaving a residual portion of said ion-stopping layer formed within said opening in said lift-off layer;

growing an oxide layer over the exposed surface of said residual portion of said ion-stopping layer;

whereby a subsequent ion-implantation step will not alter the conductivity characteristics of the region of the substrate beneath said residual portion of said ion-stopping layer.

23. The method of claim 22, wherein said lift-off resist is polymethyl methacrylate which is exposed by an electron beam to delineate said substantially vertical edge therein.

* * * * *